United States Patent
Kabbani et al.

(10) Patent No.: US 7,355,428 B2
(45) Date of Patent: Apr. 8, 2008

(54) ACTIVE THERMAL CONTROL SYSTEM WITH MINIATURE LIQUID-COOLED TEMPERATURE CONTROL DEVICE FOR ELECTRONIC DEVICE TESTING

(75) Inventors: Samer Kabbani, San Marcos, CA (US); Rick Beyerle, San Diego, CA (US); Don Bachelder, San Diego, CA (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 10/758,209

(22) Filed: Jan. 14, 2004

(65) Prior Publication Data

US 2005/0151553 A1   Jul. 14, 2005

(51) Int. Cl.
*G01R 31/02* (2006.01)
*H05K 7/20* (2006.01)
(52) U.S. Cl. .................................. 324/760; 165/80.4
(58) Field of Classification Search ............... None
See application file for complete search history.

(56) References Cited

U.S. PATENT DOCUMENTS

| | | | |
|---|---|---|---|
| 5,099,910 A | 3/1992 | Walpole et al. | |
| 5,701,666 A * | 12/1997 | DeHaven et al. | 29/831 |
| 5,821,505 A | 10/1998 | Tustaniwskyj et al. | |
| 5,977,785 A * | 11/1999 | Burward-Hoy | 324/760 |
| 6,084,215 A * | 7/2000 | Furuya et al. | 219/444.1 |
| 6,322,626 B1 * | 11/2001 | Shirley | 118/73 |
| 6,389,225 B1 | 5/2002 | Malinoski et al. | |
| 6,392,431 B1 * | 5/2002 | Jones | 324/760 |
| 6,476,627 B1 | 11/2002 | Pelissier et al. | |
| 6,489,793 B2 | 12/2002 | Jones et al. | |
| 6,606,251 B1 * | 8/2003 | Kenny et al. | 361/764 |
| 6,636,062 B2 * | 10/2003 | Gaasch et al. | 324/760 |
| 6,668,570 B2 | 12/2003 | Wall et al. | |
| 6,765,401 B2 * | 7/2004 | Hamada | 324/760 |
| 6,862,405 B2 * | 3/2005 | Malinoski et al. | 392/479 |

* cited by examiner

Primary Examiner—Ernest Karlsen
(74) Attorney, Agent, or Firm—Foley & Lardner LLP

(57) ABSTRACT

A temperature control system, which includes a miniature liquid-cooled heat sink, is used to provide a controlled temperature surface to an electronic device, such as a semiconductor device, during the testing or burn-in phase. In one embodiment, the system includes a miniature liquid-cooled heat sink device having a monolithic counter-flowing structure. In other embodiments, the system includes a heater, a flow control valve, a controller, and/or sensors.

9 Claims, 8 Drawing Sheets

ACTIVE THERMAL CONTROL SYSTEM WITH MINIATURE LIQUID-COOLED TEMPERATURE CONTROL DEVICE FOR ELECTRONIC DEVICE TESTING

FIELD OF THE INVENTION

The present invention relates generally to a temperature control system that controls the temperature of an electronic device during testing. More particularly, the present invention relates to a temperature control system that includes a miniature liquid-cooled heat sink, and active heater control, and a fluid control system for maintaining constant spatial and temporal operating temperature of the electronic device under test.

BACKGROUND OF THE INVENTION

Electronic devices, such as integrated circuit chips, are usually tested prior to use. Device manufacturers typically perform a number of electrical and physical tests to ensure that the devices are free from defects and that the devices function according to their specifications. Common types of device testing include burn-in testing and electrical performance testing.

The operating temperature of an electronic device under test ("DUT") is an important test parameter that usually requires careful monitoring and/or regulating. For example, an electrical test procedure may designate a number of specific test temperatures or a specific range of test temperatures. Consequently, the prior art is replete with different types of temperature control systems, heat sink components, and heater elements designed to heat, cool, and otherwise control the operating temperature of a DUT. These temperature control systems are designed to maintain a steady state DUT operating temperature during the electronic testing procedure.

Existing heat exchangers are constructed of multiple materials, often brazed or soldered together. Although intended to produce uniform temperature control across the control surface, heat sinks with bonded layers frequently contain interstitial voids and other material discontinuities that decrease the heat removal capacity of the assemblies and decrease their uniformity. A one-directional flow through the heat sink also causes a temperature non-uniformity (rise) as the fluid transfers heat as it passes along the heater. A high thermal mass, such as is found in thick-walled heat exchangers, causes the device to respond slowly in a rapidly changing test environment.

Existing active control systems, however, rely on constant temperature, constant flow rate coolants to remove heat, which can limit the rate of temperature response and continuously draw high amounts of power.

BRIEF SUMMARY OF THE INVENTION

A preferred embodiment of the present invention is realized as a temperature control system that includes a miniature liquid-cooled heat sink with an integrated, non-uniform heating element. The device may be used as part of a temperature control system to provide a controlled temperature surface to an electronic DUT, such as a semiconductor device, during the testing phase.

The miniature liquid-cooled heat sink device has a low thermal mass (heat capacity) structure and integral heating and sensing elements. The structure has a plurality of first fluid flow channels and a plurality of second fluid flow channels. Each of the flow channels is connected to a fluid entry portion and a fluid exit portion. The first fluid entry portion and the first fluid exit portion are on one side of the monolithic structure, and the second fluid entry portion and the second fluid exit portion are on an opposite side of the monolithic structure. The device also includes a cover covering the plurality of first flow channels and second flow channels and one or more caps covering the first fluid entry portion and the first fluid exit portion. The entry and exit portions are connected by straight or three-dimensional microchannels laid out so as to counteract temperature rise due to a single-direction flow. The heating and sensing elements are preferably embedded directly in the control surface, or they may be located in adjacent parallel layers or upstream (heaters) or downstream (sensors) from the control surface. The low thermal mass (heat capacity) device responds rapidly to input changes because input energy is converted to temperature rise rather than stored heat.

The active temperature control system manipulates a valve or other suitable flow control mechanism or system to vary the coolant flow rate to the individual units under test. The control system also manipulates heaters in the devices. These manipulations vary the DUT temperature to adjust for various test points and test power fluctuations. The system can rapidly vary the heater power to "trim" rapid fluctuations encountered during testing that are not corrected by changing the fluid conditions alone.

In other embodiments, the temperature control system includes a plurality of heaters, sensors and/or flow control valves.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

Figure 1:
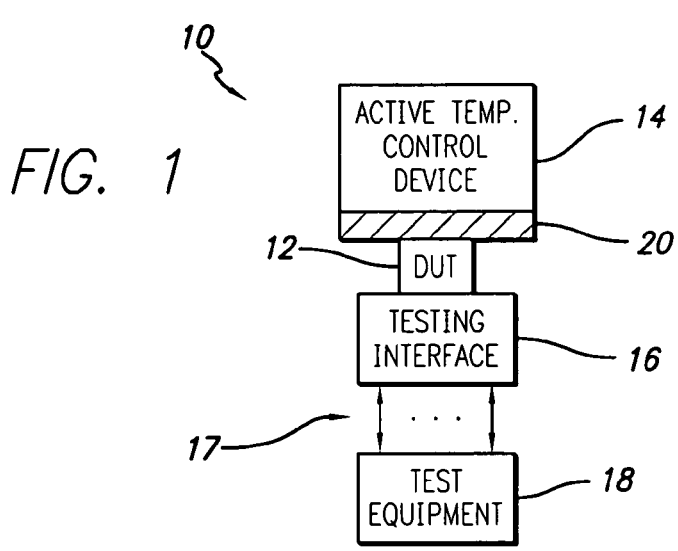
FIG. 1 is a schematic representation of a testing system for electronic devices.

FIG. 1 is a schematic representation of a testing system 10 for electronic devices, such as a DUT 12. Briefly, testing system 10 includes an active temperature control device 14 for regulating the temperature of DUT 12, a testing interface 16 that is suitably configured to receive DUT 12, and test equipment 18 coupled to testing interface 16. In a practical embodiment, testing system 10 includes a plurality of active temperature control devices 14 for conditioning a plurality of DUTs 12, and testing interface 16 is configured to accommodate a plurality of DUTs 12. For convenience, FIG. 1 only depicts one DUT 12 and one active temperature control device 14.

Testing interface 16 provides an electrical and physical coupling between DUT 12 and test equipment 18. Test equipment 18 is suitably configured to test the functional characteristics of DUT 12. In this regard, test equipment 18 can provide one or more power signals to DUT 12 and one or more I/O signals to/from DUT 12. Test equipment 18 can test and record any number of functional characteristics depending upon the type of DUT 12. For example, test equipment 18 may test one or more of the following characteristics: output power; frequency response; clock speed; logical function; opens; shorts; and the like. Active temperature control device 14 includes a thermal transfer surface 20 that is configured to establish a thermal path to and from DUT 12. Active temperature control device 14 functions to regulate the temperature of DUT 12 during the testing procedure, to condition the temperature of DUT 12 before the testing procedure, and/or to condition the temperature of DUT 12 after the testing procedure.

Figure 2:
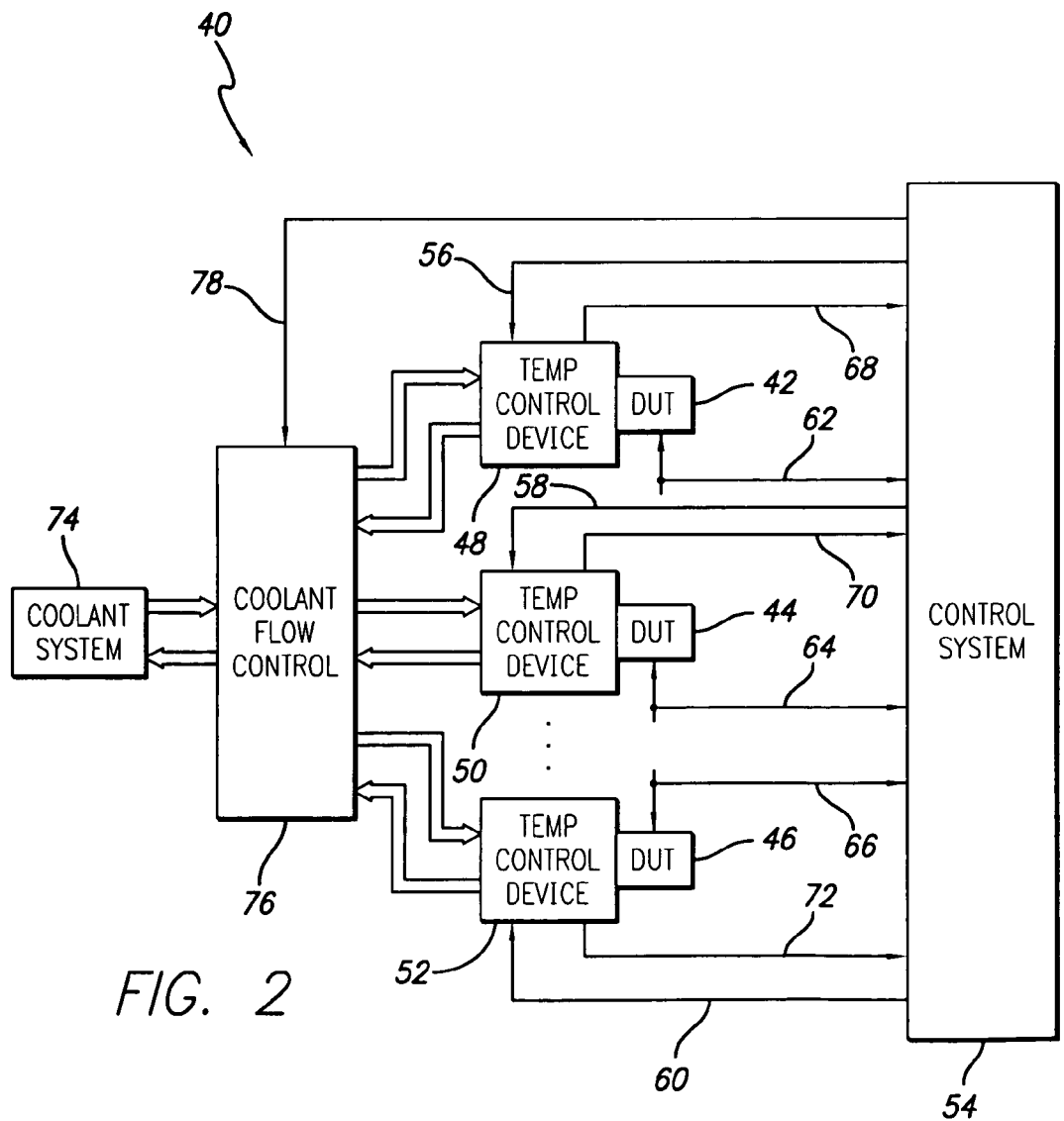
FIG. 2 is a schematic representation of an active thermal control system for regulating the temperature of one or more DUTs.

FIG. 2 is a schematic diagram of an active thermal control ("ATC") system 40 for regulating the temperature of one or more DUTs (identified by reference numbers 42, 44, and 46). This system can also be employed to regulate the temperature of one or more devices during a bum-in procedure. The ellipsis in FIG. 2 indicate that any number of DUTs can be supported by ATC system 40. For purposes of the example embodiment described herein, the DUTs are electronic semiconductor circuit devices, such as microprocessor chips. Alternatively, the DUTs may be any electronic, mechanical, or other device being subjected to one or more tests performed under specific temperature settings. ATC system 40 may cooperate with a suitable testing system (e.g., as shown in FIG. 1) that provides a power supply, flow control, input signals, and possibly other inputs to the DUTs. A typical testing system also monitors a number of outputs and signals generated by the DUTs during the test procedure.

The DUTs are preferably held against or in close proximity to a respective temperature control device (identified by reference numbers 48, 50, and 52), each of which is configured to concurrently provide a hot source and a cold source to the respective DUT. The hot source may be a heater element or other suitably configured coolant control system or apparatus. In the preferred embodiment, a portion of the DUT, such as the device lid, contacts the respective temperature control device. In a practical embodiment, each temperature control device is coupled to a chuck assembly (not shown) and the DUTs are cradled in a compatible carrier interface (not shown). The chuck assembly and carrier are clamped together during thermal conditioning, testing, and cool-down of the DUTs. In response to such clamping, the DUTs are forced into physical contact with the temperature control devices. Such clamping ensures that heat is effectively transferred between the DUTs and the respective temperature control devices. Alternatively, the DUTs may be held against the temperature control devices using a vacuum device or any suitable holding mechanism.

The temperatures of the temperature control devices 48/50/52 (in particular, the temperature of the heater elements and/or the coolant flow rates) are regulated by a suitably configured regulator, e.g., a control system 54. In the illustrated embodiment, control system 54 generates heater control signals 56/58/60 that serve as input signals to the respective heater elements contained in the various temperature control devices. The heater control signals may be generated by control system 54 in response to one or more testing criteria, operating conditions, or feedback signals. For example, control system 54 may generate the heater control signals in response to any of the following parameters: test temperature settings associated with the current testing specification for the DUTs; input signals utilized by the DUTs, e.g., an input power signal, an input voltage, or an input current; signals indicative of the real-time operating temperature of the DUTs; signals indicative of the real-time operating temperature of an internal component of the DUTs; signals indicative of the real-time temperature of a portion of the temperature control devices; the RF signature of the DUTs; or the like.

Control system 54 may also receive one or more signals 62/64/66 indicative of the input power to the respective DUTs 42/44/46 and/or one or more signals 68/70/72 indicative of the real-time operating temperature of a portion of the respective DUTs 42/44/46 (such as the lids of the DUTs or dies contained in the DUTs); these signals can be processed by control system 54 according to a temperature control algorithm to generate the individual heater control signals. For example, a simple algorithm may adjust the heater control signals in response to the measured temperature of the respective DUTs such that the operating temperature of the DUTs is maintained at a specific temperature. Alternatively, the control algorithm may generate heater control signals in response to the input power of the DUTs.

A practical ATC system 40 can be designed to accommodate test temperatures between −55 and 155 degrees Celsius. However, most electronic devices are typically tested at temperatures between −45 and 120 degrees Celsius (these example temperature ranges may change in the future and the present invention is not limited to any specific range of test temperatures). In addition, electronic device test specifications do not usually call for temperature transients, i.e., most electronic testing is performed at a substantially steady state operating temperature. In this respect, ATC system 40 may also include a suitable regulator, e.g., a coolant system 74, that cooperates with the temperature control devices to individually regulate the temperature of the cold source (e.g., a heat sink element). Coolant system 74 regulates the temperature of the coolant, regulates individual flow rates of the coolant for each temperature control device, pumps the coolant into the respective temperature control devices, and receives the return coolant from the temperature control devices (the coolant flow paths are identified by the thick arrows in FIG. 2).

ATC system 40 may employ any coolant having the desired thermal properties. For example, ATC system 40 may use water, air, a refrigerant, or any fluid substance. The preferred embodiment utilizes HFE as the coolant, the flow rate can vary between approximately 0.2 to 4.0 gallons per minute, and coolant system 74 maintains the temperature of the water at a temperature below (usually substantially below) the coldest test temperature associated with the particular test specification. Coolant system 74 can also regulate the flow rate to accommodate large temperature changes (which may be required to accommodate single-insertion multiple-temperature testing of a single device).

In operation, ATC system 40 may thermally condition the DUTs by gradually increasing the temperature of a DUT until it reaches the specified operating temperature. Thereafter, the conditioned DUT is then subjected to the functional testing as required by the test specification. ATC system 40 monitors the temperature of each DUT during the functional test and regulates the temperature of the heating element associated with the respective temperature control device. Under most circumstances, coolant system 74 will maintain a steady state coolant temperature and flow rate during the testing cycle, which contributes to the regulation of the operating temperature of the DUT.

The ATC system 40 may employ a coolant flow control system 76. In the example embodiment depicted in FIG. 2, coolant flow control system 76 is coupled to each active temperature control device 48/50/52 to provide individualized coolant flow rates. Coolant flow control system 76 is suitably configured to regulate the flow rate of coolant through the respective fluid-cooled heat sinks in the temperature control devices. Coolant flow control system 76 may receive one or more control signals 78 from control system 54; such control signals 78 influence the manner in which coolant flow control system 76 regulates the coolant flow to the individual temperature control devices. For example, coolant flow control system 76 can control the flow rates of coolant in cooperation with one or more heater control signals 56/58/60. Referring back to FIG. 1, testing interface 16 provides a number of DUT control signals 17 to DUT 12. Coolant flow control system 74 can control the flow rates of coolant in cooperation with at least one or these DUT control signals 17, e.g., a power signal for the respective DUT.

Coolant flow control system 76 preferably regulates the individual flow of coolant through each of the fluid-cooled heat sinks in the ATC system 40. In this manner, coolant flow control system 76 can adjust the flow rate of the coolant to vary the temperature of the DUTs for testing under different conditions, to achieve a specified test temperature for the DUTs before testing, and/or to achieve an ambient temperature for the DUTs after testing.

The active temperature control device is designed to provide a controlled temperature surface to an electronic device, such as a semiconductor device, during the testing phase (and during soak and de-soak phases). The semiconductor device is placed either directly in contact with the temperature control device or uses an interface material or area-adapting heat spreader, such as a metal plate, while in use. The temperature control device described herein employs a fluid counter-flow configuration that prevents or reduces a temperature rise on the heat sink surface as the coolant flows beneath it. The temperature control device includes a miniature liquid-cooled heat sink with monolithic structure. The monolithic design is one piece and increases the thermal conductivity by eliminating brazing joints due to differential thermal expansion. The monolithic design also reduces the overall thermal mass, which reduces the correction time in response to a change in test signal, and which ensures that fluid flowing through the fluid channels will effectively and repeatedly remove heat from the system. The temperature control device further includes a heating element and may also include sensing elements. In use, the heating element heats the device to a desired set temperature, while the coolant flowing through the fluid-cooled heat sink removes excess heat from the device and heater. In the example embodiment, which has electronic heating and individualized flow rate control, the low thermal mass device allows very rapid corrections to deviations from the set point temperature.

Figure 3:
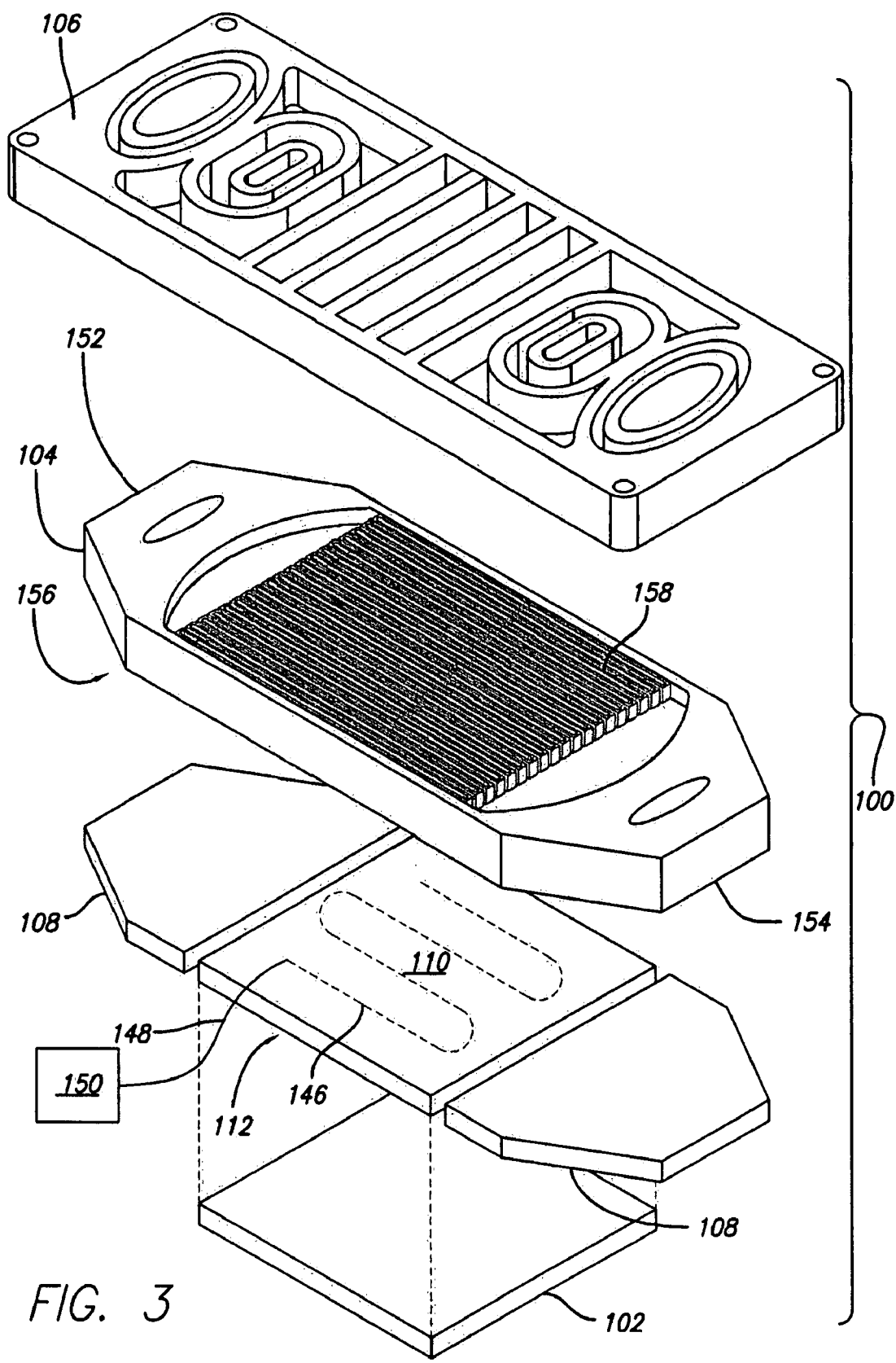
FIG. 3 is an exploded isometric view of a temperature control device for regulating the temperature of a device under test.
Figure 4:
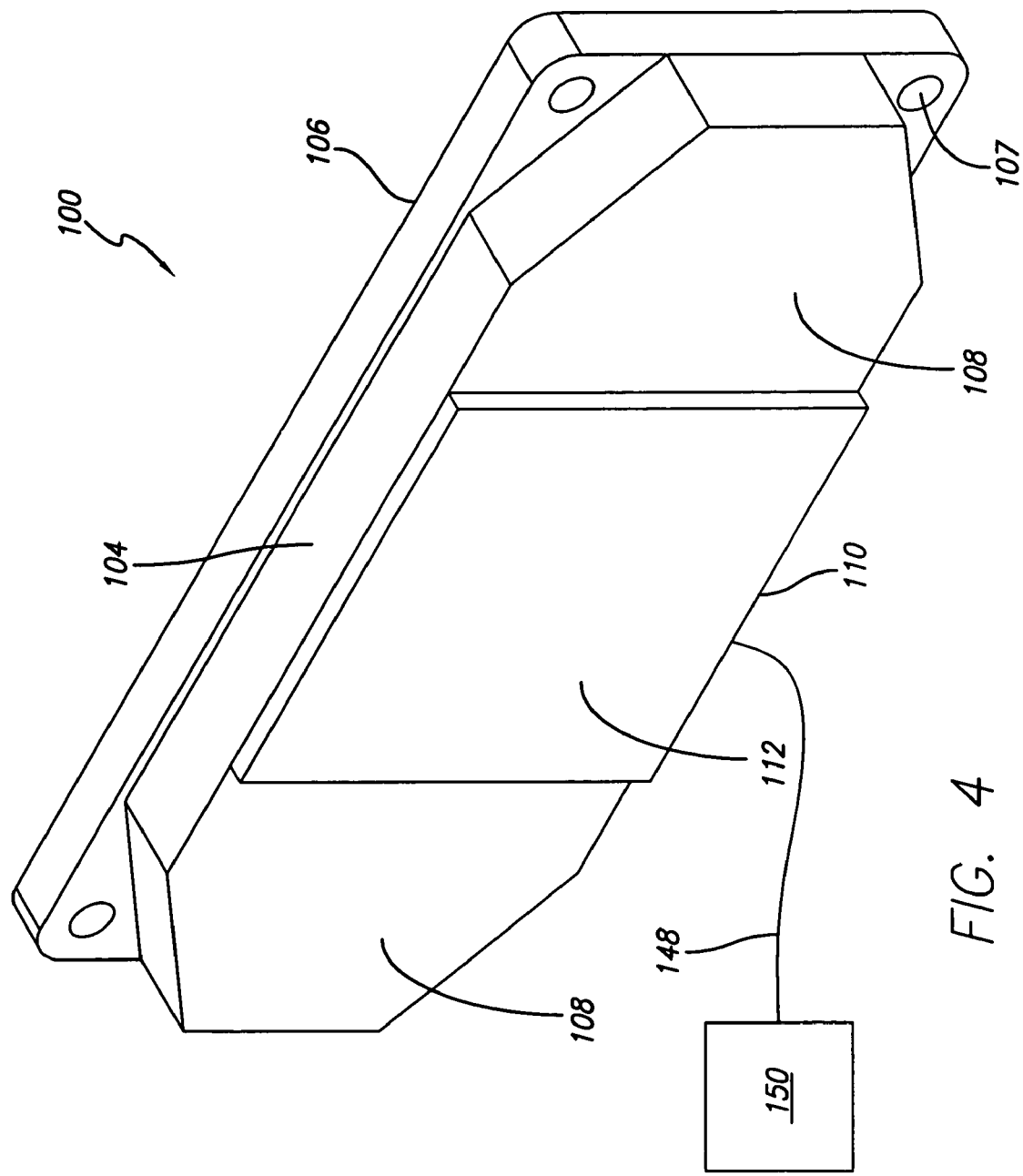
FIG. 4 is perspective view of the temperature control device.

FIG. 3 is an exploded view and FIG. 4 is a perspective view of one embodiment of a temperature control device 100 suitable for use in regulating the temperature of a DUT 102. Device 100 is one example of a temperature control device suitable for use in connection with system 10 (see FIG. 1) or system 40 (see FIG. 2).

The temperature control device 100 includes a miniature liquid-cooled heat sink with monolithic structure 104, a cover 106, caps 108, and a heater 110. The temperature control device 100 is designed to provide a controlled temperature at an interface surface or first side 112 that provides a thermal transfer path from the temperature control device 100 to the DUT 102. The DUT 102 is preferably held against or in close proximity to an interface surface 112 of the temperature control device 100. The DUT 102 is placed either directly in contact with the interface surface 112, or with an interface material or area-adapting heat spreader, such as a metal plate, while in use. To regulate the temperature at the interface surface 112, the heater 110 is turned on to provide heat and a fluid is directed through cooling passages, described below, to provide cooling. The subsequent figures and text will describe the cooling passages and heater and their locations.

Figure 5:
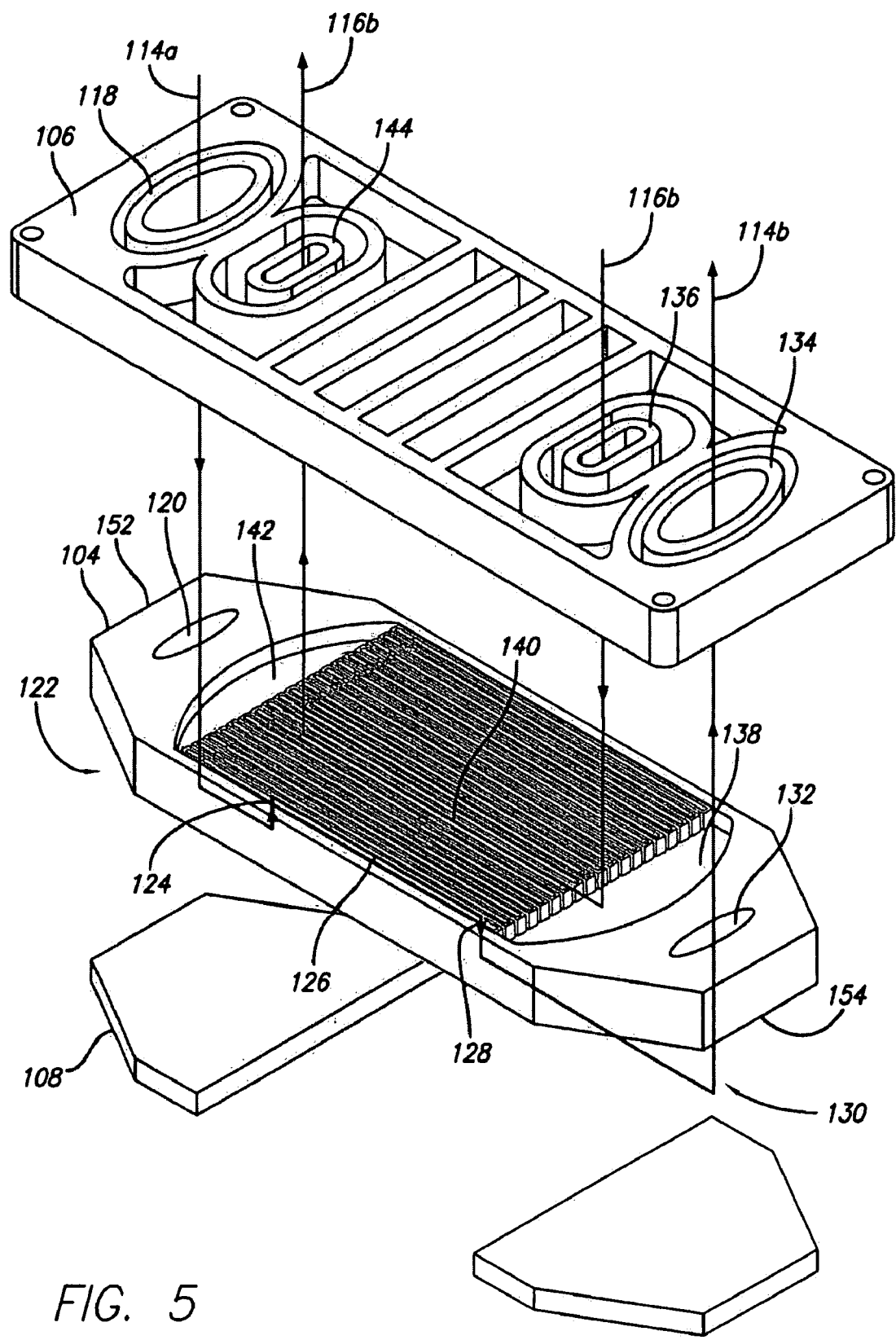
FIG. 5 is an exploded perspective view showing the cooling system.
Figure 6:
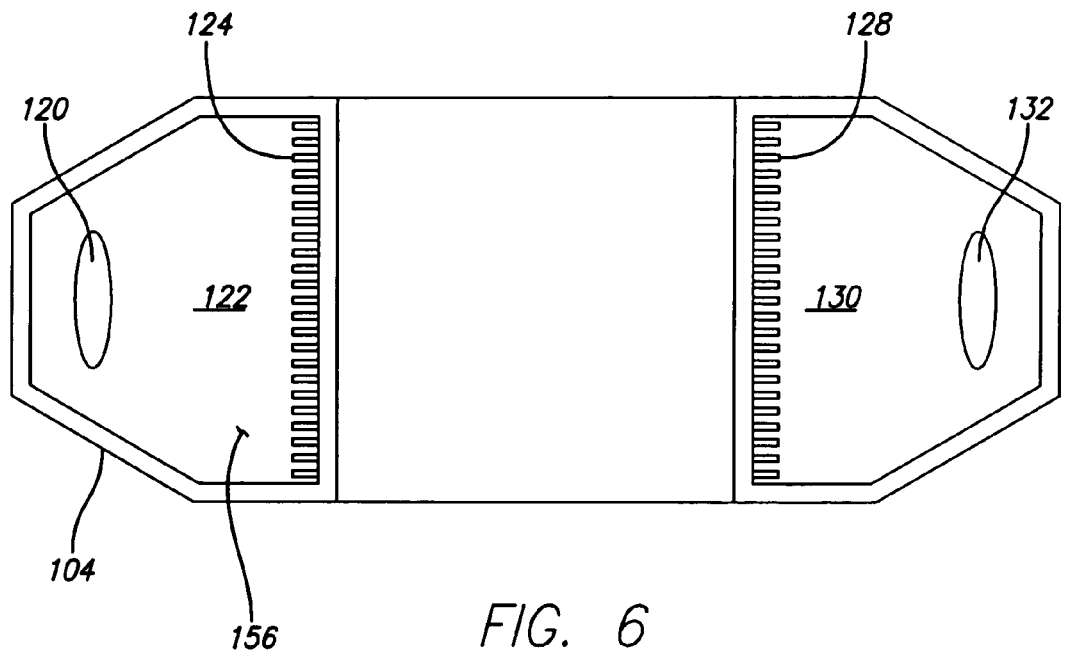
FIG. 6 is a bottom view of the monolithic structure.

To cool the temperature control device 100, a fluid is passed through internal cooling passages. The fluid may be water, air, a refrigerant, or any fluid substance having the desired thermal properties. FIG. 5 is an exploded view showing the cooling portion of the temperature control device 100. The cooling portion includes two cooling passages 114 and 116 that go through the temperature control device 100. Each cooling passage has an inlet, an outlet and a heat transfer portion that, when combined, creates a continuous fluid conduit through the device. The inlets and outlets are positioned or formed in the cover 106. A coolant system (not shown) may provide the fluid and cooperate with temperature control device 100 to regulate the temperature and flow rate of the fluid. The coolant system pumps the fluid into temperature control device 100 through the inlets and receives the return fluid from the outlets. The inlet and outlet ports may be designed with internal threads such that suitable fluid fittings (not shown) can be attached. The fluid fittings receive fluid delivery hoses or conduits that carry the fluid between the temperature control device 100 and coolant system. The cover 106 has multiple passages to direct the fluid flow to the other components and keep each of the fluid passages separate. The flow of the fluid paths through the cooling passages 114 and 116 are shown in FIG. 5. Notably, these cooling passages 114/116 maintain a counter-flow, e.g., a cross-flow, of coolant through the heat sink and relative to the thermal transfer surface of the device. See also FIG. 6, which shows a bottom, first side or interface side of the monolithic structure 104, and FIG. 7, which shows a second side, top side or flow channel side of the monolithic structure 104.

Figure 7:
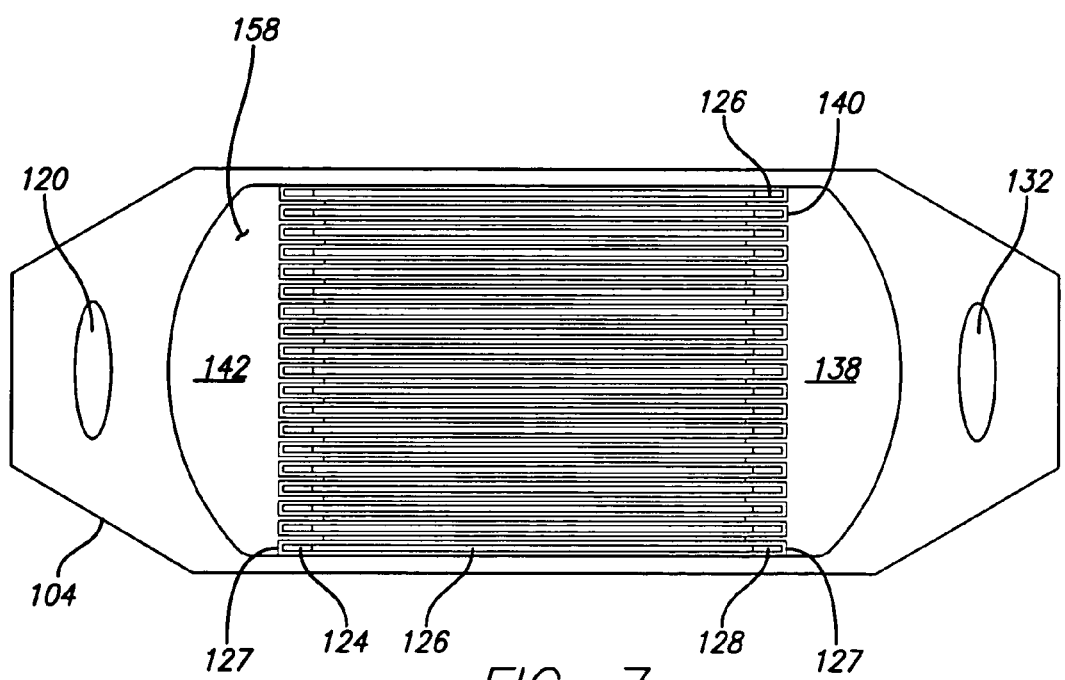
FIG. 7 is a top view of the monolithic structure.

The first cooling passage 114 starts at a first inlet 118, located in cover 106, opening to a passage 120 at a first end 152 of the monolithic structure 104. The passage 120 leads to a first fluid entry portion 122 on a first side 156, shown in FIG. 6. A plurality of first entry openings 124 between the first side 156 and a second side 158 lead from the first fluid entry portion 122 into one end of a plurality of first flow channels 126 on the second side. At the other end of the plurality of first flow channels 126 are a plurality of first exit openings 128 between the second side 158 and the first side 156. The ends 127 of the first flow channels 126 are closed to block any fluid from entering the second cooling passage 116, as depicted in FIG. 7. The plurality of first exit openings 128 lead to a first fluid exit portion 130 on the second side 158, shown in FIG. 6. A passage 132 at a second end 154 of the monolithic structure 104 leads from the first fluid exit portion 130 to a first fluid outlet 134. All of the components listed for the first cooling passage 114 are in fluid communication with each other so that fluid may flow from the first inlet to the first outlet.

The second cooling passage 116 starts at the second inlet 136 in cover 106, opening to a second entry portion 138 at the second end 154 of the monolithic structure 104. The second entry portion 138 leads to a plurality of second flow channels 140, both on the second side 158. At the other end of the plurality of second flow channels 140 is a second exit portion 142 on the second side 158 that leads to a second fluid outlet 144. All of the components listed for the second cooling passage 114 are in fluid communication with each other so that fluid may flow from the second inlet to the second outlet. In the figures shown, the monolithic structure 104 is designed such that the first fluid entry portion 122 and the first fluid exit portion 130 are on the first side 152 of the monolithic structure 104 and the second entry portion 138 and the second exit portion 142 are on a second side 154 of the monolithic structure 104. When the cover 106 is attached or joined to the monolithic structure 104, it seals the second side 158 so that fluid stays in the first fluid flow channel 126 and the second fluid flow channel 140 flow channel and enters and exits at their ends. When the caps 108 are attached or joined to the monolithic structure 104, they seal a portion of the first side 156 proximate the first fluid entry portion 122 and the first fluid exit portion 130 so that fluid flows in the cooling passage 114.

The flow channels are designed such that fluid enters near one end, travels through various openings or passages to a second end, where it exits the flow channels. As shown in FIG. 7, the plurality of second flow channels 140 alternate with the plurality of first flow channels 126. The first flow channels 126 have closed ends 127 to prevent fluid from entering from the second entry portion 138 or exiting to the second exit portion 142. The particular design of the first and second fluid flow channels 126, 140 may depend on any number of parameters such as the thermal properties of the material, the thermal and physical properties of the fluid, the flow rate of the fluid, the size device, and the like. The fluid can flow in either direction in the cooling passages, but for enhanced performance, the fluid should flow in opposite directions in each passage. The flow channels may be straight (as depicted in FIG. 7), curved, or convoluted in three dimensions depending upon the particular application. Furthermore, the flow channels may return to their respective side of origin rather than exit the other side.

The heater 110 is used to apply heat and sense temperature. While the figures show the heater as a single layer, it may also be multiple layers. The heater 110 may be made of electrically resistive serpentine traces 146 on a substrate having an external connection 148 connected to a controller 150. The heater element 110 may also function as a resistance temperature detector ("RTD") or be adjacent to another trace that functions as an RTD. The substrate may be made from silicon, ceramic or other appropriate material. The resistive traces 146 may provide uniform heating or may be arranged to provide differential heating with differential control. The heater 110 is shown proximate the interface surface 112 between the caps 108 and first fluid entry portion 122 and the first fluid exit portion 130. In other configurations, the heater 110 may only cover a portion of the interface surface. In still other configurations, the caps 108 may incorporate or function as heaters.

Electrically conductive "ink" may be used to form the electrically resistive serpentine traces 146 on the substrate. In accordance with one practical embodiment, the conductive ink includes a nickel alloy having a relatively high electrical resistance. The substrate is patterned and the conductive ink is printed onto the surface of the substrate, which might then be joined to additional layers by stacking. Signal wires or leads 148 are soldered or otherwise attached to the respective traces to carry the control signals from the control system 150. The electrical heating elements traces are not exposed to the DUT.

The temperature control device 100 may be regulated by a suitably configured control system 150. Sensing elements (not shown) may be used to provide input to the control system to monitor the temperature of the temperature control device 100 and determine when it should be heated or cooled. The control system 150 generates a control signal that serves as an input signal to the heater and/or cooling system contained in temperature control device 100. The control signal may be generated by control system 150 in response to one or more testing criteria, operating conditions, or feedback signals. For example, control system 150 may generate a control signal in response to any of the following parameters: a test temperature setting associated with the current testing specification for DUT 102; an input signal utilized by DUT 102, e.g., an input power signal, an input voltage, or an input current; a signal indicative of the real-time operating temperature of DUT 102; a signal indicative of the real-time operating temperature of an internal component of DUT 102, e.g., a semiconductor die; a signal indicative of the real-time temperature of a portion of temperature control device 100; the RF signature of DUT 102; or the like.

Figure 8:
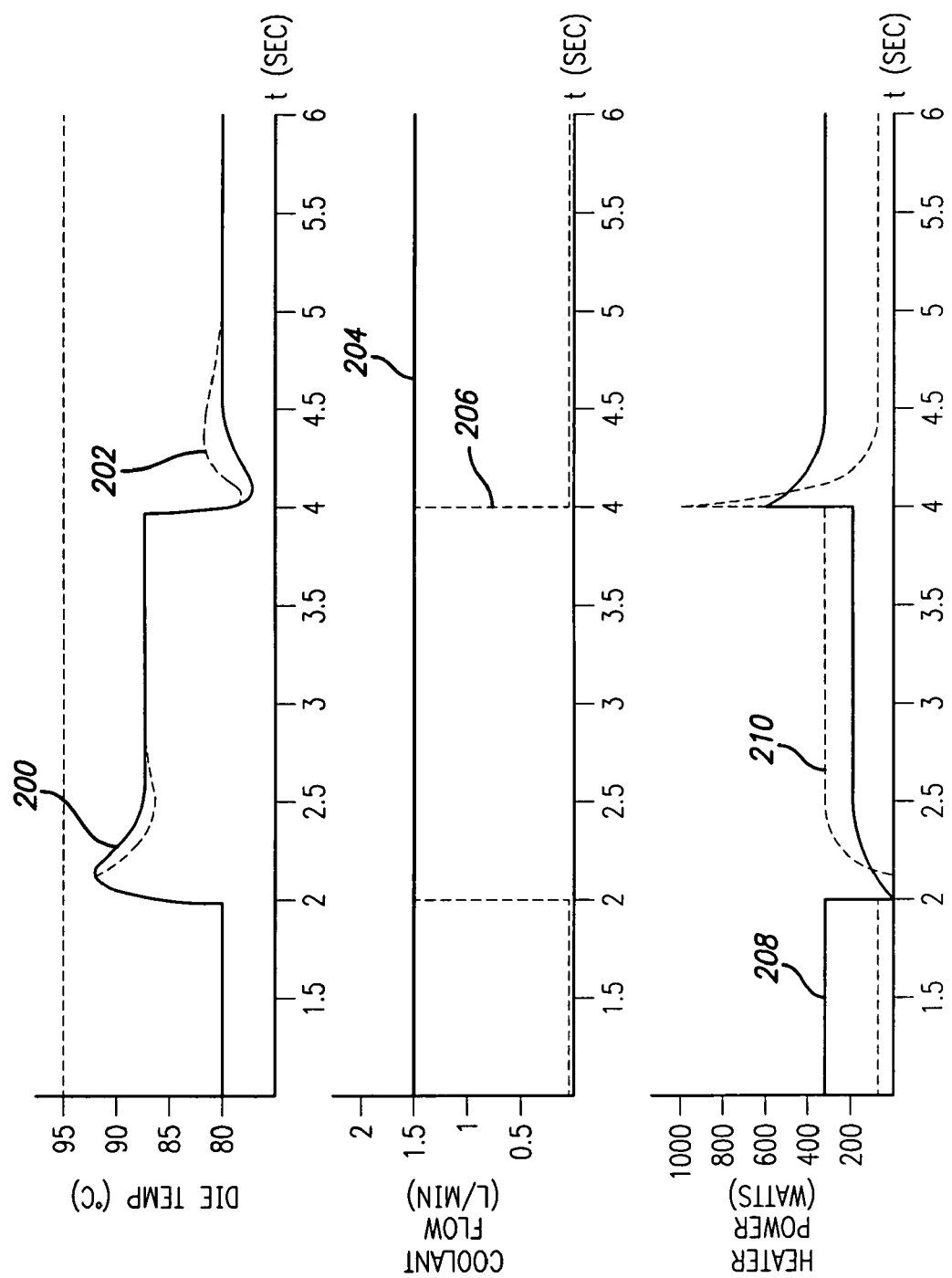
FIG. 8 is a graph comparing the simulated die junction temperature (Tj), coolant flow rate, and heater power in a device cooled at a constant flow rate with an identical device cooled at a variable flow rate.

A comparison of an electronic-only versus a fluid-electronic control hybrid is shown in FIG. 8, which is a graph comparing the simulated die junction temperature (Tj), coolant flow rate, and heater power in a device cooled at a constant flow rate with an identical device cooled at a variable flow rate. In the hybrid version, the coolant flow is regulated downward to reduce the compensating heater power during non-test conditions. The plot 200 represents Tj over time for a device cooled at a constant coolant flow rate, while the plot 202 represents Tj over time for a device cooled at a variable coolant flow rate (note that portions of plot 200 and plot 202 overlap each other). Notably, plot 202 has a faster settling time associated with the target test temperature and at approximately the four second mark, plot 202 experiences approximately 32% less undershoot of the target Tj of 80 degrees. The plot 204 represents the constant coolant flow rate, while the plot 206 represents the variable coolant flow rate that increases during the device testing phase (in this example, device testing occurs between the two and four second marks). The plot 208 represents the temperature control device heater power for the constant flow rate version, while the plot 210 represents the heater power for the variable flow rate version. Notably, there is a significant saving in power consumption during the non-testing phases.

Figure 9A:
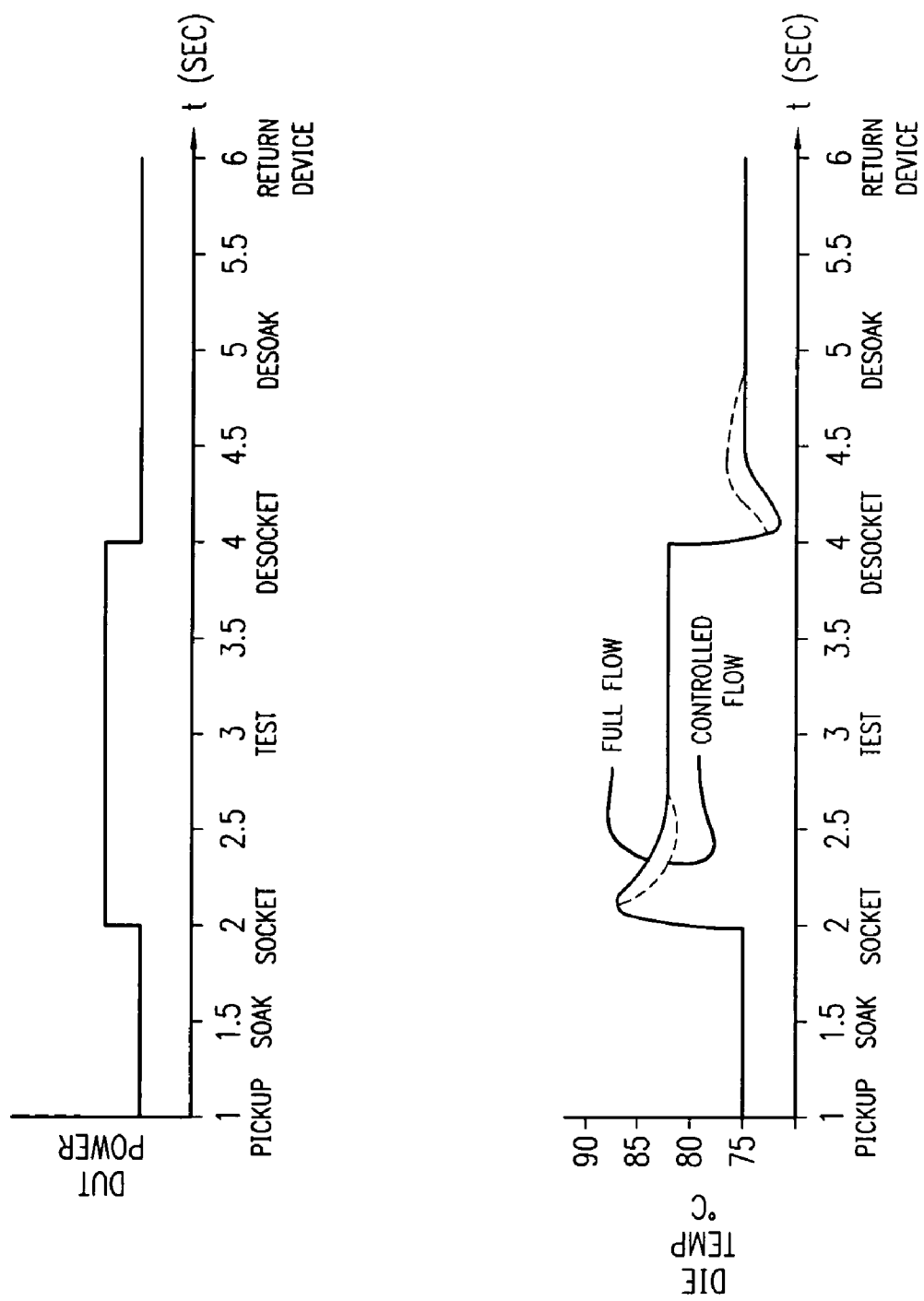
FIGS. 9A and 9B are graphs that represent an example device handling sequence that charts the thermal loads from a device pick up stage to a device return stage.
Figure 9B:
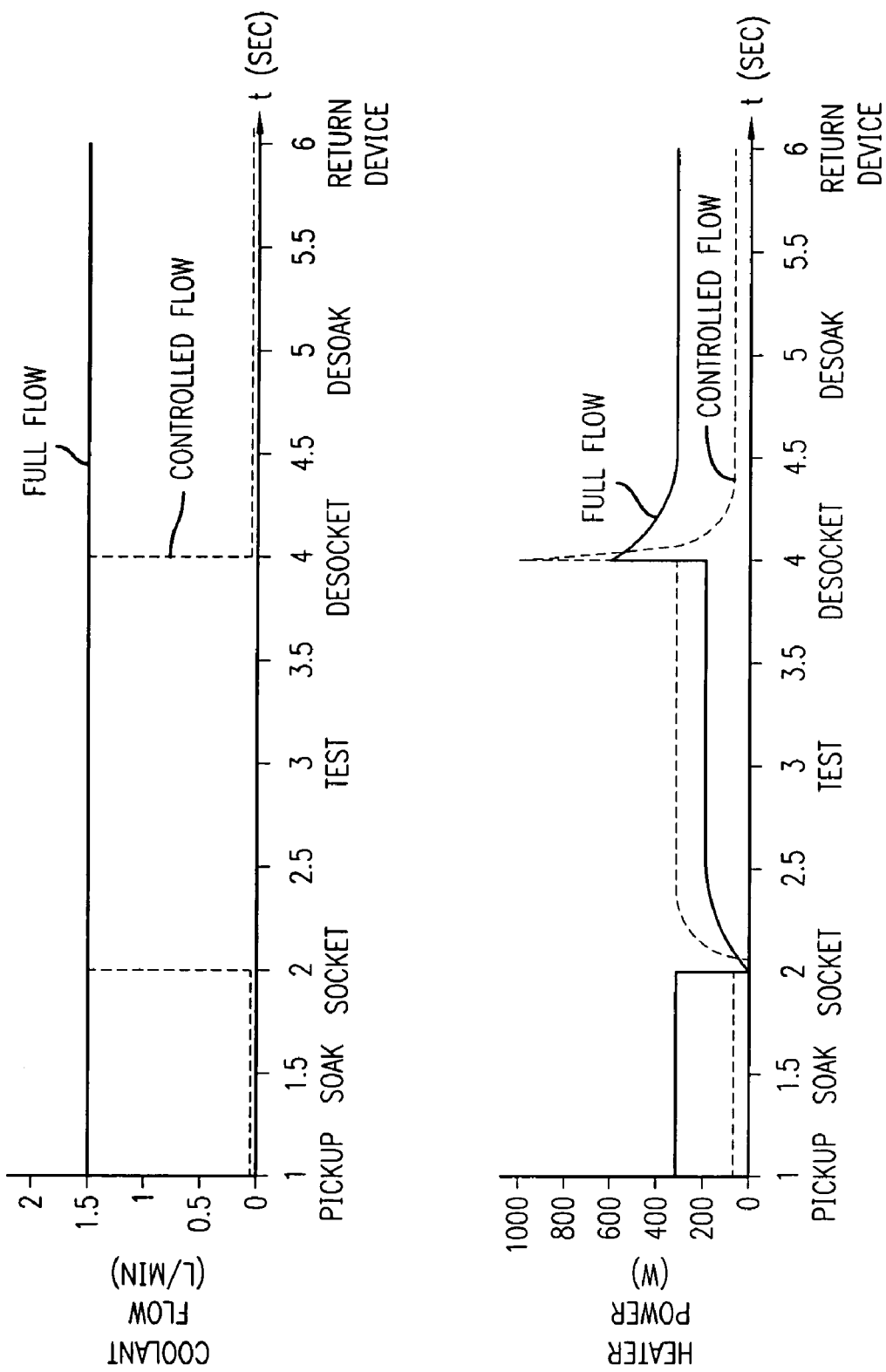

FIGS. 9A and 9B are graphs that represents an example device handling sequence that charts the thermal loads from a device pick up stage to a device return stage. This schematic profile of events during the testing of an individual DUT shows the power and temperature levels that occur during a typical soak (preheat), test, desoak (cooldown) sequence. In the context of a testing system that simultaneously handles a plurality of DUTs, the coolant flow rate to each temperature control device can vary over time. In such an energy-saving embodiment, the coolant flow rate can be reduced during the segments of the test profile that do not produce DUT heating, as depicted in FIG. 8.

Of course, the size and shape of the controlled thermal interface surface 112 of the temperature control device 100 may be suitably configured to mate with the size and shape of the particular DUT 102. For example, to test a common microprocessor, the size of the device may be 1 inch wide by 2 inches long and 0.25 inches thick, whereas the heater 110 may be may be 1 inch square. Alternatively, a suitably configured mating element, formed from a thermal conductor, can be placed between temperature control device 100 and the DUT 102. A mating element may be desirable to accommodate the specific physical characteristics of the DUT or to concentrate heating or cooling in certain areas of the DUT.

As mentioned above, the liquid-cooled heat sink includes a number of flow channels that are configured and arranged to promote heat transfer to the fluid or coolant. The flow channels are also parallel to the fluid flow path. In accordance with a practical embodiment, each of the flow channels is approximately 0.01 inches thick. Furthermore, neighboring flow channels are separated by approximately 0.01 inches. Alternatively, the liquid-cooled heat sink may employ any suitable flow channel design and the particular design may depend on any number of parameters such as the thermal properties of the heat sink material, the thermal and physical properties of the coolant, the flow rate of the coolant, the size of flow channel, and the like.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. A testing system for electronic devices, said testing system comprising:
   a plurality of active temperature control devices for regulating the temperature of at least one device under test ("DUT"), each of said active temperature control devices comprising:
      a thermal transfer surface configured to establish a thermal path to a respective DUT;
      a fluid-cooled heat sink thermally coupled to said thermal transfer surface, said fluid-cooled heat sink being configured to maintain a flow of coolant proximate said thermal transfer surface; and
      a heater configured to heat the respective thermal transfer surface; and
   a coolant flow control system coupled to said active temperature control devices, said coolant flow control system being configured to individually regulate the flow rate of coolant through each fluid-cooled heat sink.

2. A testing system according to claim 1, wherein said coolant flow control system adjusts the flow rate of coolant to vary the temperature of DUTs for testing under different conditions.

3. A testing system according to claim 1, wherein said coolant flow control system adjusts the flow rate of coolant to achieve a test temperature for DUTs before testing.

4. A testing system according to claim 1, wherein said coolant flow control system adjusts the flow rate of coolant to achieve an ambient temperature for DUTs after testing.

5. A testing system according to claim 1, wherein for each of said active temperature control devices:
   the temperature of said heater is controlled by a respective heater control signal; and
   said coolant flow control system controls the respective flow rate of coolant in cooperation with said respective heater control signal.

6. A testing system according to claim 1, wherein said fluid-cooled heat sink is configured to maintain a counter-flow of coolant relative to said thermal transfer surface.

7. A testing system according to claim 1, wherein said fluid-cooled heat sink has a monolithic design.

8. A testing system according to claim 1, wherein said fluid-cooled heat sink comprises two cooling passages, wherein each cooling passage has an inlet, an outlet and a heat transfer portion that, when combined, creates a continuous fluid conduit through the active temperature control device.

9. A testing system according to claim 8, wherein said two cooling passages maintain a counter-flow of coolant through the heat sink and relative to the thermal transfer surface of the device.

* * * * *